(12) United States Patent
Wada (10) Patent No.: US 6,403,994 B1
(45) Date of Patent: Jun. 11, 2002

(54) SOLID-STATE IMAGING DEVICE AND METHOD OF FABRICATING THE SAME

(75) Inventor: Kazushi Wada, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/640,548

(22) Filed: Aug. 17, 2000

(30) Foreign Application Priority Data

Aug. 23, 1999 (JP) .......................................... 11-235759

(51) Int. Cl.$^7$ ..................... H01L 27/148; H01L 29/768
(52) U.S. Cl. ..................... 257/229; 257/223; 257/232; 257/233; 438/60; 438/75
(58) Field of Search ................................. 257/232, 233, 257/222, 223, 229; 438/60, 75

(56) References Cited

U.S. PATENT DOCUMENTS 5,898,195 A * 4/1999 Harada ........................ 257/223
5,962,882 A * 10/1999 Sin ............................. 257/222

FOREIGN PATENT DOCUMENTS

JP          9-331058           12/1997

* cited by examiner

Primary Examiner—Ngân V. Ngô
(74) Attorney, Agent, or Firm—Rader, Fishman & Grauer (57) ABSTRACT

A solid-state imaging device includes a second conductive type impurity region formed in a first conductive type semiconductor substrate in an area corresponding to a pixel area, a high-resistivity semiconductor layer of the first conductive type formed on the semiconductor substrate including the impurity region, and an ion-implanted region of the first conductive type formed in at least one of the semiconductor substrate and the high-resistivity semiconductor layer in a peripheral area other than the pixel area. A method of fabricating the solid-state imaging device is also disclosed.

7 Claims, 10 Drawing Sheets

PRIOR ART

FIG. 10

SOLID-STATE IMAGING DEVICE AND METHOD OF FABRICATING THE SAME

BACKGROUND OF THE INVENTION

1. Field of the Invention

The present invention relates to a solid-state imaging device and a method of fabricating the same.

2. Description of the Related Art

As one of solid-state imaging devices, a solid-state imaging device having a so-called "vertical overflow drain structure" is well known, in which excess charges in light-receiving sections (sensor sections) are drained toward a substrate.

The present applicant for the invention has disclosed a solid-state imaging device having the vertical overflow drain structure in which a depletion region in a light-receiving section is made of a high-resistivity epitaxial layer with a thickness of 2 μm or more so that the solid-state imaging device has sensitivity also in the near infrared range (refer to Japanese Unexamined Patent Application Publication No. 9-331058).

Figure 9:
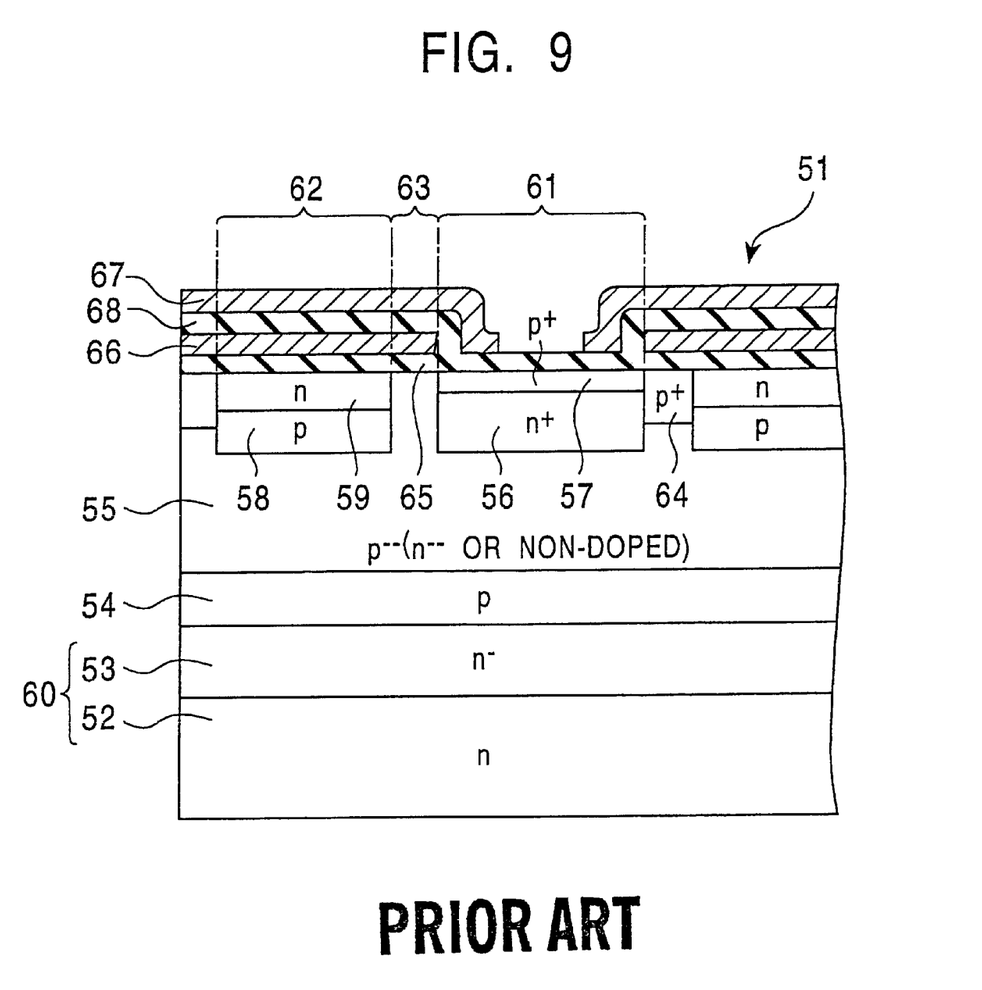
FIG. 9 is a sectional view of a pixel area of a conventional CCD solid-state imaging device in which an overflow barrier region is formed.

FIG. 9 shows the solid-state imaging device described above.

A solid-state imaging device 51 includes a semiconductor substrate 52 composed of a first conductive type, for example, n-type, silicon, and an epitaxial layer 53 of the same conductive type with a low impurity concentration (i.e., n⁻) formed on the semiconductor substrate 52. The semiconductor substrate 52 and the epitaxial layer 53 constitute an n-type semiconductor base 60. A first semiconductor well region 54 of a second conductive type, for example, p type, which acts as an overflow barrier region, is formed within the epitaxial layer 53 of the semiconductor base 60. A high-resistivity semiconductor region, i.e. a so-called high-resistivity epitaxial layer 55, having a higher resistivity than that of the first p-type semiconductor well region 54, is formed on the first p-type semiconductor well region 54 by epitaxial growth.

The high-resistivity epitaxial layer 55 has a thickness of 2 μm or more, preferably, 5 μm or more, and is composed of a p-type region or an n-type region having a lower concentration than that of the first p-type semiconductor well region 54, or a non-doped (intrinsic semiconductor) region.

An n⁺ semiconductor region 56 and a p⁺ positive charge storage region 57 located thereon for constituting each of the light-receiving sections (sensor sections) 61 arrayed in a matrix are formed in vicinity of the surface of the high-resistivity epitaxial layer 55. An n-type transfer channel region 59 of a vertical transfer register 62 is formed in the high-resistivity epitaxial layer 55 on one side of each column of the light-receiving sections with a read-out gate section 63 therebetween. A second p-type semiconductor well region 58 is formed beneath the transfer channel region 59. A p-type channel stop region 64 for delimiting the individual light-receiving sections 61 is also formed.

A transfer electrode 66 composed of, for example, polycrystalline silicon, is formed on the transfer channel region 59, the channel stop region 64, and the read-out gate section 63, with a gate insulating film 65 therebetween. The transfer channel region 59, the gate insulating film 65, and the transfer electrode 66 constitute the vertical transfer register 62 having a CCD structure. A shading film 67 is formed over the entire surface excluding the aperture of each light-receiving section 61 with an interlayer insulating film 68 covering the transfer electrode 66 therebetween.

In such a manner, the CCD solid-state imaging device 51 having the vertical overflow drain structure is constructed, in which the light-receiving section 61, the first p-type semiconductor well region 54 acting as the overflow barrier region, and the substrate 52 acting as an overflow drain are formed in the vertical direction.

In the CCD solid-state imaging device 51, the overflow barrier region 54 is formed at a depth which allows infrared rays to be sufficiently absorbed, and as the high-resistivity epitaxial layer 55 reaching the overflow barrier region 54 becomes depleted, sensitivity is provided also for the near infrared range.

In the CCD solid-state imaging device 51, for example, in order to obtain desired characteristics of the CCD solid-state imaging device 51, the high-resistivity epitaxial layer 55 is occasionally formed as an n-type region.

However, when the high-resistivity epitaxial layer 55 is formed as the n-type region, p-type impurities which are ion-implanted in the overflow barrier region 54 before the high-resistivity epitaxial layer 55 is formed may be diffused into the n-type high-resistivity epitaxial layer 55 when the high-resistivity epitaxial layer 55 is formed.

Figure 10:
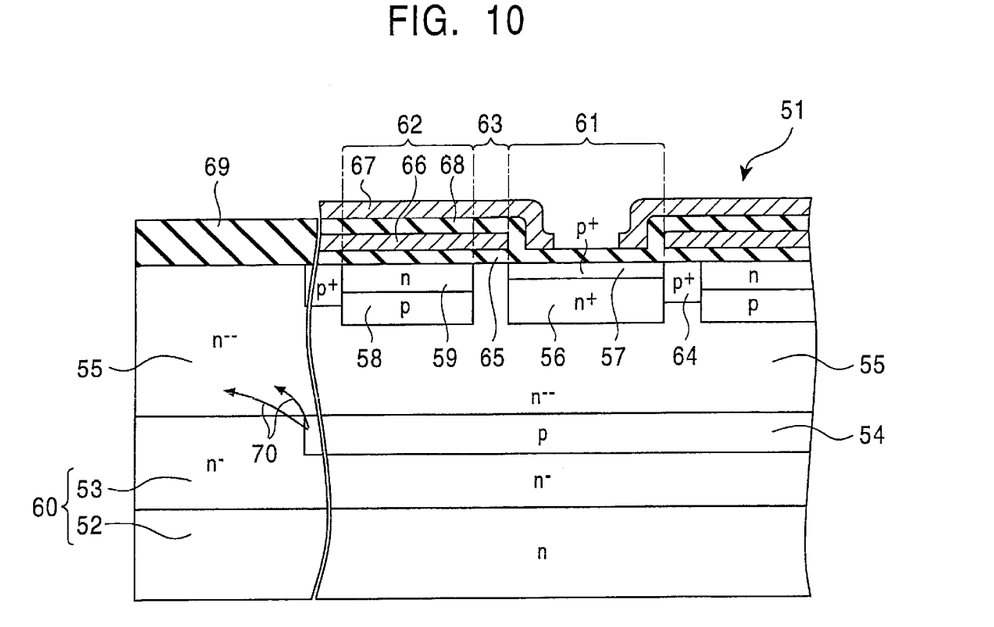
FIG. 10 is a schematic diagram which illustrates the diffusion of p-type impurities into a peripheral area in the conventional structure.

Specifically, as indicated by arrows 70 shown in FIG. 10, p-type impurities are diffused along the interface between the high-resistivity epitaxial layer 55 and the n⁻ epitaxial layer 53 located therebelow, and consequently, are diffused into a peripheral area other than the pixel area in which the overflow barrier region 54 is not formed.

If the p-type impurities are diffused into the high-resistivity epitaxial layer 55 in the peripheral area as described above, the breakdown voltage of a protection transistor formed in the peripheral area may be decreased, or a leakage current may occur at a pn junction. Consequently, the characteristics of the CCD solid-state imaging device 51 are degraded, resulting in a decrease in the yield during the fabrication.

SUMMARY OF THE INVENTION

Accordingly, it is an object of the present invention to provide a solid-state imaging device which has stable characteristics and can be fabricated with a high yield rate, and to provide a method of fabricating the same.

In one aspect of the present invention, a solid-state imaging device includes a second conductive type impurity region formed in a first conductive type semiconductor substrate in an area corresponding to a pixel area, a high-resistivity semiconductor layer of the first conductive type formed on the semiconductor substrate including the impurity region, and an ion-implanted region of the first conductive type formed in at least one of the semiconductor substrate and the high-resistivity semiconductor layer in a peripheral area other than the pixel area.

In another aspect of the present invention, a method of fabricating a solid-state imaging device includes a step of forming an impurity region by doping impurities of a second conductive type in a first conductive type semiconductor substrate in an area corresponding to a pixel area, a step of growing a high-resistivity epitaxial layer of the first conductive type on the semiconductor substrate including the impurity region of the second conductive type, and at least one of a step of ion-implanting impurities of the first conductive type in the first conductive type semiconductor substrate in a peripheral area other than the pixel area and a step of ion-implanting impurities of the first conductive type in the high-resistivity epitaxial layer in the peripheral area.

In accordance with the solid-state imaging device of the present invention, since the ion-implanted region of the first conductive type is provided in the peripheral area, second conductive type impurities diffused from the impurity region of the second conductive type can be inhibited from influencing circuit elements formed in the peripheral area.

In accordance the present invention, since the method of fabricating the solid-state imaging device includes at least one of the step of doping impurities of the first conductive type in the first conductive type semiconductor substrate in the peripheral area and the step of ion-implanting impurities of the first conductive type in the high-resistivity epitaxial layer in the peripheral area, even if second conductive type impurities are diffused from the second conductive type impurity region in the fabrication process, the implanted first conductive type impurities can suppress or cancel the influence of the second conductive type impurities to circuit elements to be formed in the peripheral area.

DESCRIPTION OF THE PREFERRED EMBODIMENTS

Figure 1:
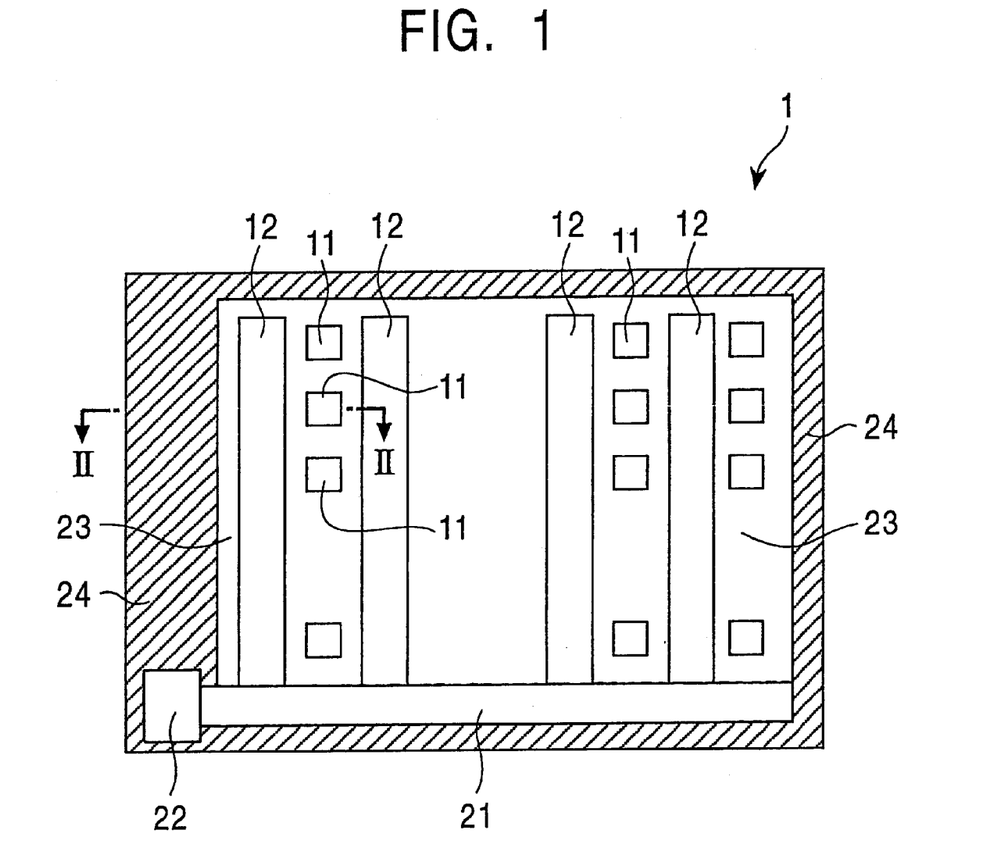
FIG. 1 is a plan view which schematically shows a CCD solid-state imaging device in an embodiment of the present invention.

FIG. 1 is a plan view which schematically shows a CCD solid-state imaging device in an embodiment of the present invention.

A CCD solid-state imaging device 1 is provided with an imaging area 23 which includes a plurality of light-receiving sections (sensor sections) 11 composed of photosensors for performing photoelectric conversion arrayed in a matrix and a plurality of vertical transfer registers 12, corresponding to the individual columns of the light-receiving sections 11, having a CCD structure. A horizontal transfer register 21 having a CCD structure is disposed at one end of the imaging area 23 for transferring signal charges from the imaging area 23 to an output section 22, which is connected to an end of the horizontal transfer register 21.

A peripheral area 24 indicated by slanted lines in the drawing as an area other than the area corresponding to the pixel area is placed outside the imaging area 23, the horizontal transfer register 21, and the output section 22, and various circuits, such as driving circuits, protection transistors, etc. (not shown in the drawing) are formed in the peripheral area 24.

Figure 2:
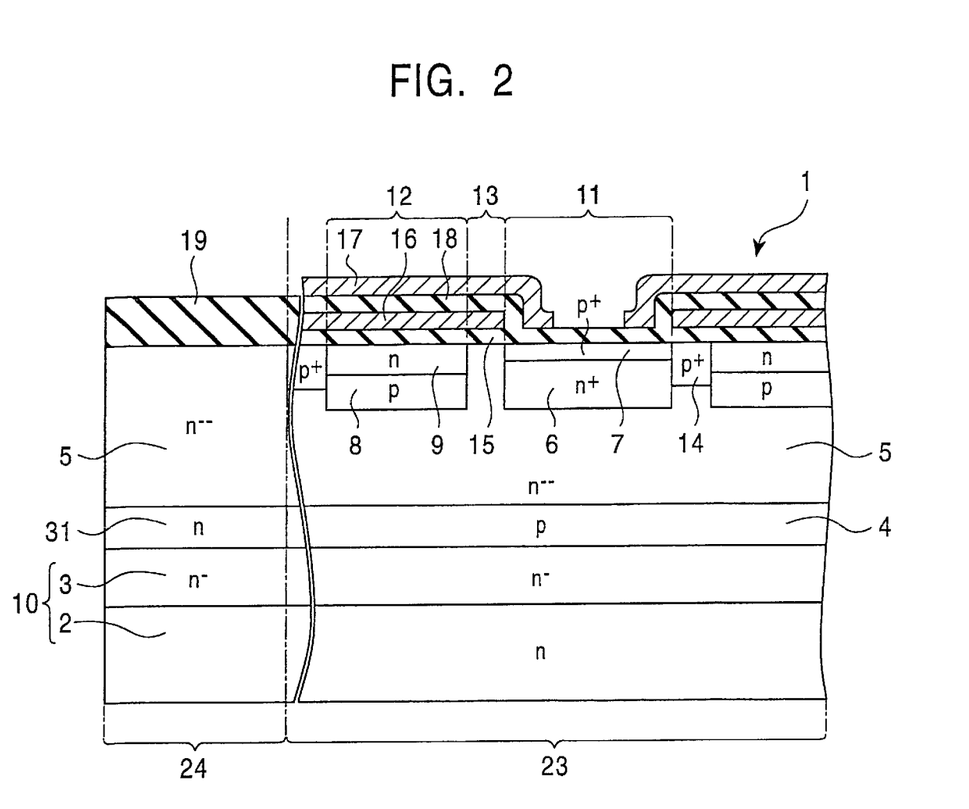
FIG. 2 is a sectional view taken along the line II—II of FIG. 1.

FIG. 2 is a sectional view taken along the line II—II of FIG. 1. On a silicon substrate 2 of a first conductive type, for example, n-type, an epitaxial layer 3 of the first conductive type, for example, n-type, having a resistivity of, for example, 40 to 50 Ωcm is formed. A semiconductor region of a second conductive type, i.e., a first p-type semiconductor well region 4, is formed by ion implantation in the n-type epitaxial layer 3 in an area corresponding to the imaging area 23, and a high-resistivity epitaxial layer having a resistivity of, for example, 100 to 500 Ωcm, is formed on the n-type epitaxial layer 3.

An $n^+$ impurity diffusion region 6 and a $p^+$ positive charge storage region 7 located thereon for constituting the light-receiving section (sensor section) 11 are formed in the vicinity of the surface of the high-resistivity epitaxial layer 5. A second p-type semiconductor well region 8 and an n-type transfer channel region 9 are formed in the high-resistivity epitaxial layer 5 at a distance from the light-receiving section 11, and a p-type channel stop region 14 is also formed.

Herein, the first p-type semiconductor well region 4 acts as a so-called "overflow barrier region". The light-receiving section 11 corresponds to a pixel, and a plurality of the light-receiving sections 11 are arrayed in a matrix.

A read-out gate section 13 is formed between the light-receiving section 11 and the vertical transfer register 12 which will be described below.

A transfer electrode 16 composed of, for example, polycrystalline silicon, is formed on the transfer channel region 9, the channel stop region 14, and the read-out gate section 13 with a gate insulating film 15 therebetween. The transfer channel region 9, the gate insulating film 15, and the transfer electrode 16 constitute the vertical transfer register 12 having a CCD structure.

A shading film 17 is formed over the entire surface excluding the aperture of the light-receiving section 11 with an interlayer insulating film 18 covering the transfer electrode 16 therebetween.

As described above, the CCD solid-state imaging device 1 having a so-called "vertical overflow drain structure" is constructed, in which the light-receiving section 11, the first p-type semiconductor well region 4 acting as the overflow barrier region, and the substrate 2 acting as an overflow drain are formed in the vertical direction.

Additionally, the first p-type semiconductor well region 4 is also formed below the horizontal transfer register 21 and the output section 22.

In this embodiment, an n-type ion-implanted region 31 is further formed within the $n^-$ epitaxial layer 3 in the peripheral area 24 indicated by slanted lines in FIG. 1 to constitute the CCD solid-state imaging device 1.

Since the first conductive type, i.e., n-type, ion-implanted region 31 is formed within the $n^-$ epitaxial layer 3 in the peripheral area 24, the occurrence of a pn junction due to the diffusion of p-type impurities from the first p-type semiconductor well region is suppressed, and the degradation in the characteristics can be prevented.

Consequently, in the embodiment described above, degradation in the characteristics of the CCD solid-state imaging device 1 can be prevented.

Furthermore, in this embodiment, it is possible to change the amount of n-type impurities in the n-type ion-implanted region 31 in the peripheral area 24 in response to the concentration of the first p-type semiconductor well region 4, and thereby the peripheral area 24 can be stably maintained as the n type.

Since the concentration of the n-type impurities in the peripheral area 24 can be set freely, with respect to a protection transistor formed in the peripheral area 24, for example, a protection transistor in which the high-resistivity epitaxial layer 5 is used as a collector and a base and an emitter are added thereto, setting of the breakdown voltage of the transistor can be easily optimized.

The CCD solid-state imaging device 1 can be fabricated, for example, by a method described below.

Figure 3A:
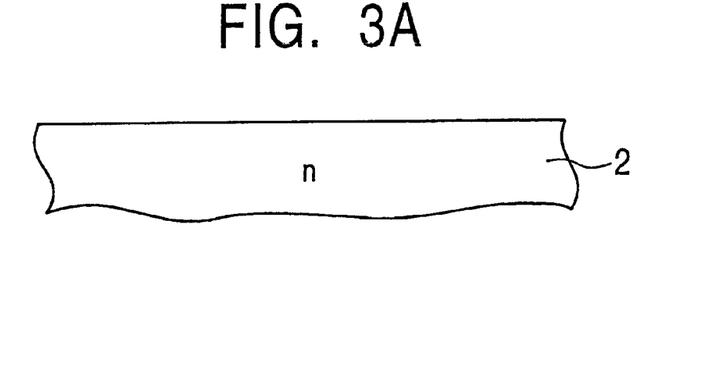
FIGS. 3A to 3C are sectional views illustrating the fabrication steps of the CCD solid-state imaging device shown in FIGS. 1 and 2.

As shown in FIG. 3A, the first conductive type, for example, n-type, semiconductor substrate 2 is prepared.

Figure 3B:
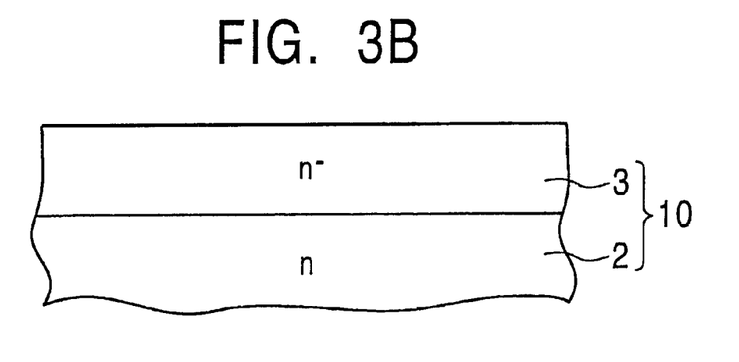

Next, as shown in FIG. 3B, the first conductive type, i.e. $n^-$, epitaxial layer 3 is formed on the first conductive type semiconductor substrate 2 by epitaxial growth.

Figure 3C:
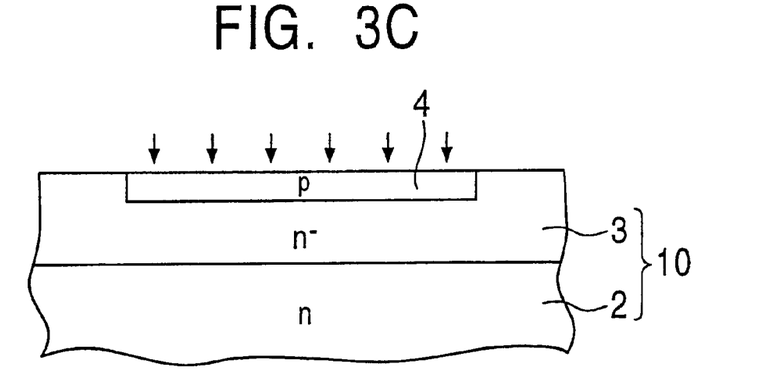

Next, as shown in FIG. 3C, by ion-implanting impurities with low energy into a portion of the $n^-$ epitaxial layer 3, the second conductive type, i.e., p-type, first semiconductor well region 4 is formed.

The first p-type semiconductor well layer 4 is formed in the entire imaging area 23 and in the area in which the horizontal transfer register 21 and the output section 22 are formed in FIG. 1.

Figure 4A:
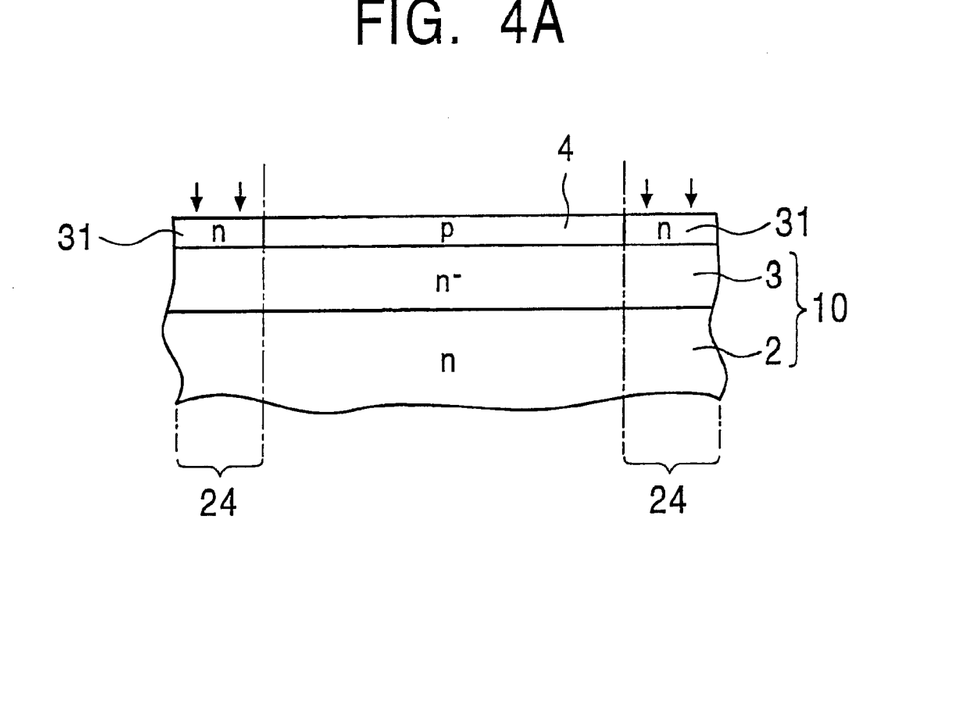
FIGS. 4A and 4B are sectional views illustrating the fabrication steps of the CCD solid-state imaging device shown in FIGS. 1 and 2.

Next, as shown in FIG. 4A, n-type impurities are ion-implanted into the $n^-$ epitaxial layer 3 in the peripheral area 24 to form the n-type ion-implanted region 31.

Figure 4B:
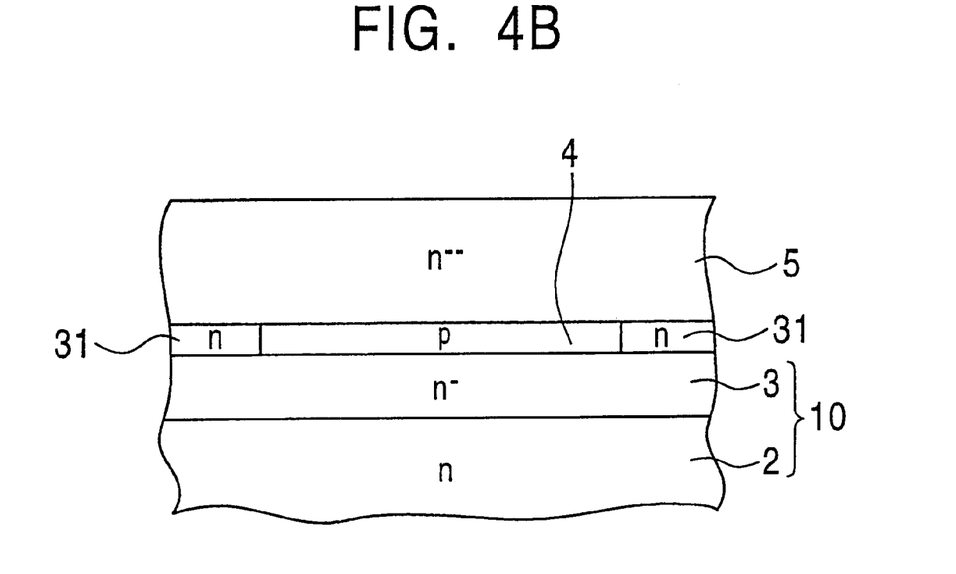

Next, as shown in FIG. 4B, the n-type high-resistivity epitaxial layer 5 is formed by epitaxial growth on the $n^-$ epitaxial layer 3 in which the first p-type semiconductor well region 4 and the n-type ion-implanted region 31 are formed.

Subsequently, although not shown in the drawing, the second p-type semiconductor well region 8, the n-type transfer channel region 9, and the p-type channel stop region 14 are formed in the high-resistivity epitaxial layer 5 by ion implantation.

Next, the gate insulating film 15 is formed so as to cover the entire surface, and the transfer electrode 16 composed of a polysilicon layer is formed selectively thereon.

By performing ion implantation using the transfer electrode 16 as a mask, the $n^+$ impurity diffusion region 6 and the $p^+$ positive charge storage region 7 are formed.

The transfer electrode 16 is then covered by the interlayer insulating film 18, and the shading film 17 composed of a light-shielding metal, such as aluminum, is formed thereon. The shading film 17 is provided with an aperture at a portion corresponding to the light-receiving section 11. On the other hand, in the peripheral area 24, a relatively thick insulating film 19 is formed.

By such a method, the CCD solid-state imaging device 1 shown in FIGS. 1 and 2 is fabricated.

By fabricating the CCD solid-state imaging device 1 as described above, since it is possible to form the n-type ion-implanted region 31 so that variations in the thickness of the n-type impurity region and in the concentration of the n-type impurities can be suppressed in the peripheral area 24, inconsistencies in the characteristics of circuit elements to be formed in the peripheral area 24 are suppressed, and the CCD solid-state imaging device 1 can be fabricated with a high yield rate.

Next, another method of fabricating the CCD solid-state imaging device 1 shown in FIGS. 1 and 2 in this embodiment will be described.

Up to the steps shown in FIGS. 3A to 3C, the same steps are followed.

Figure 5A:
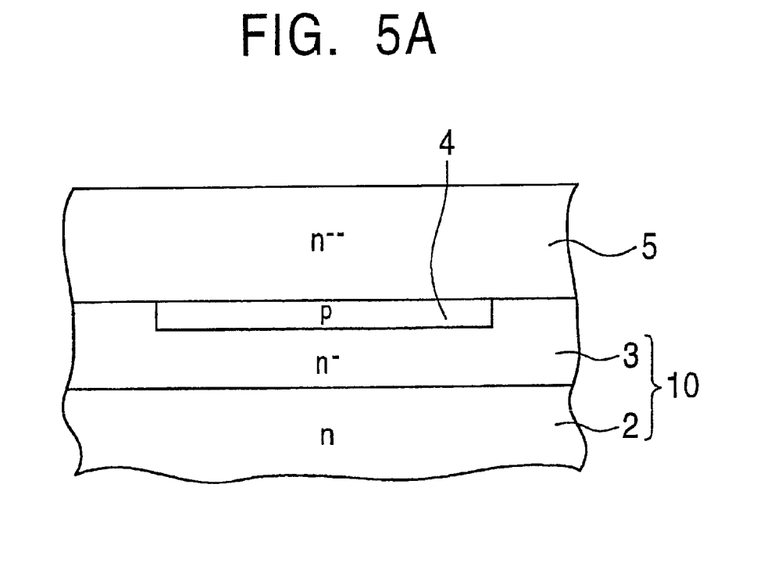
FIGS. 5A and 5B are sectional views illustrating the other fabrication steps of the CCD solid-state imaging device shown in FIGS. 1 and 2.

After the step shown in FIG. 3C, as shown in FIG. 5A, the n-type high-resistivity epitaxial layer 5 is formed by epitaxial growth above the epitaxial layer 3 and the first p-type semiconductor well region 4.

Figure 5B:
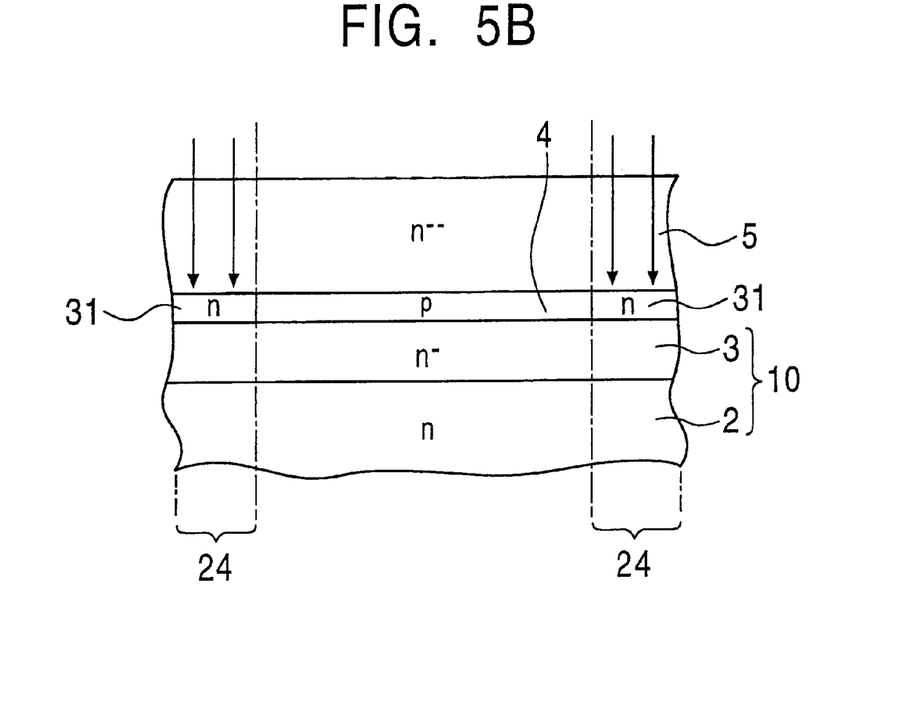

Next, as shown in FIG. 5B, by ion-implanting n-type impurities into the $n^-$ epitaxial layer 3 in the peripheral area 24 with a relatively large amount of energy, the n-type ion-implanted region 31 is formed.

After the above step, although not shown in the drawing, in the same manner as that of the previous method, the CCD solid-state imaging device 1 shown in FIGS. 1 and 2 can be formed.

Additionally, the ion implantation step for forming the n-type ion-implanted region 31 shown in FIG. 5B may be carried out after the ion implantation step for forming the second p-type semiconductor well region 8 and the n-type transfer channel region 9 constituting the vertical transfer register 12.

However, the ion implantation step for forming the n-type ion-implanted region 31 is preferably carried out at least before the step of forming the insulating film 19. If the ion implantation step is carried out after the formation of the insulating film 19, the amount of energy for the ion implantation must be increased.

Additionally, when n-type impurities are ion-implanted after the high-resistivity epitaxial layer 5 is formed as shown in FIGS. 5A and 5B, since the n-type impurities are not affected by the high temperature during the formation of the epitaxial layer 5, it is possible to form a stable n-type region.

Next, another embodiment of a solid-state imaging device in the present invention will be described.

In this embodiment, an ion-implanted region is formed in a high-resistivity epitaxial layer.

Figure 6:
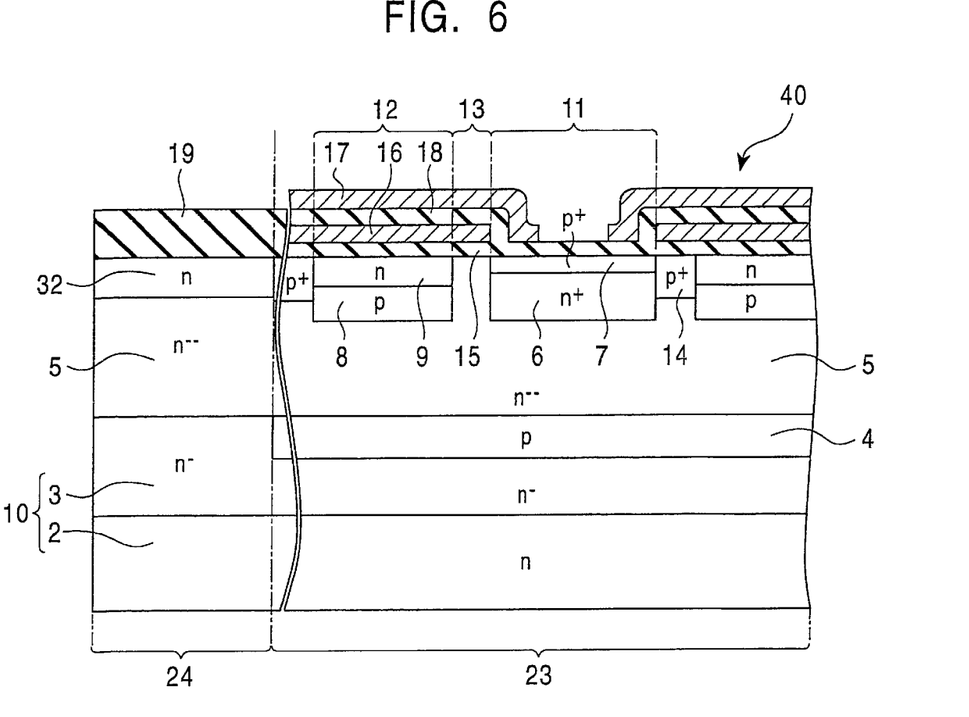
FIG. 6 is a sectional view which schematically shows a major portion of a CCD solid-state imaging device in another embodiment of the present invention.

FIG. 6 is a sectional view which schematically shows a major portion of a CCD solid-state imaging device in the embodiment. FIG. 6 shows the cross section of the same portion as that of the cross section in FIG. 2.

A CCD solid-state imaging device 40 includes an n-type ion-implanted region 32 in the vicinity of the surface of an n-type high-resistivity epitaxial layer 5 in a peripheral area 24. The structure other than the peripheral area 24 is the same as that in the previous embodiment shown in FIGS. 1 and 2.

In this embodiment, since the n-type ion-implanted region 32 is formed on the surface of the high-resistivity epitaxial layer 5 in the peripheral area 24 in which protection transistors, etc. and peripheral circuits are to be formed, even if p-type impurities are diffused, the influence of the diffusion can be suppressed or cancelled by the n-type ion-implanted region 32.

Therefore, it is possible to prevent such circuit elements from being affected by the diffusion of p-type impurities, and the portion for forming the circuit elements can be stably maintained as the n-type region.

The CCD solid-state imaging device 40 can be fabricated by a method described below.

Up to the steps shown in FIGS. 3A to 3C, the same steps are followed.

Figure 7A:
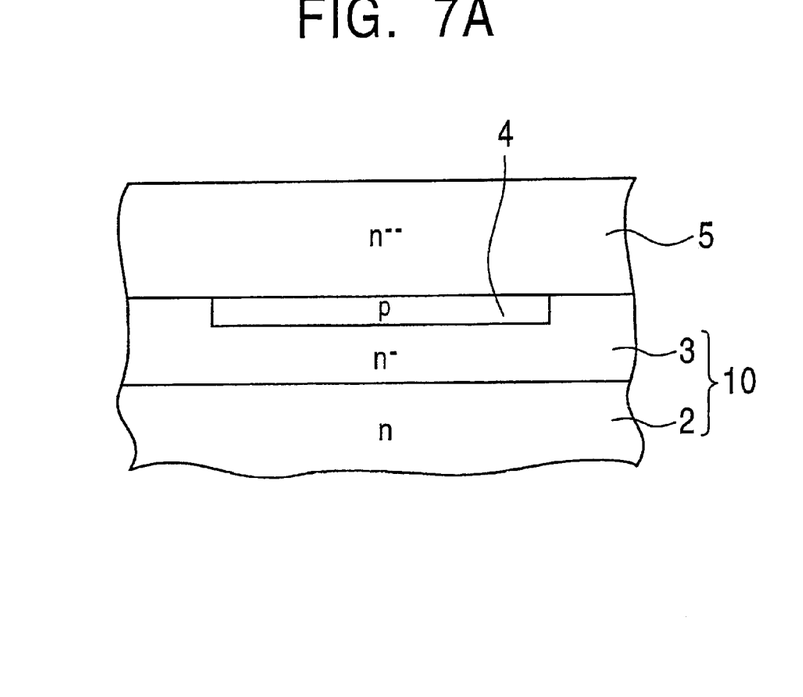
FIGS. 7A and 7B are sectional view illustrating the fabrication steps of the CCD solid-state imaging device shown in FIG. 6.

After the step shown in FIG. 3C, as shown in FIG. 7A, the n-type high-resistivity epitaxial layer 5 is formed by epitaxial growth above an epitaxial layer 3 and a first p-type semiconductor well region 4.

Figure 7B:
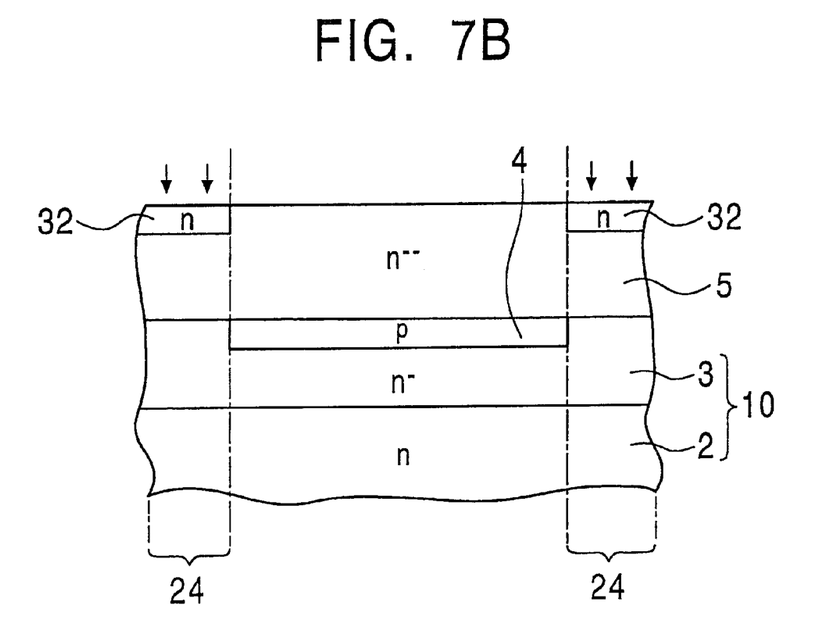

Next, as shown in FIG. 7B, by ion-implanting n-type impurities into the n-type high-resistivity epitaxial layer 5 in the peripheral area 24, the n-type ion-implanted region 32 is formed.

After the above step, although not shown in the drawing, in the same manner as that of the method in the previous embodiment, the CCD solid-state imaging device 40 shown in FIG. 6 can be fabricated.

In such a case, since n-type impurities are also ion-implanted after the high-resistivity epitaxial layer 5 is formed, the n-type impurities are not affected by the high temperature during the formation of the epitaxial layer 5, and thus a stable n-type region can be formed.

Additionally, with respect to the individual embodiments described above, in any one of the fabrication methods described above, the ion implantation of n-type impurities is performed, for example, at an energy of approximately 50 to 2,000 keV, and at a dose of approximately $1 \times 10^{12}$ to $1 \times 10^{14}$ $cm^{-2}$. In FIGS. 4A and 7B, the amount of energy is small, and in FIG. 5B, the amount of energy is relatively large.

In the above embodiments, although either the n-type ion-implanted region 31 or 32 is formed in the n⁻ epitaxial layer 3 or the high-resistivity epitaxial layer 5, the n-type ion-implanted region may be formed in both regions.

Figure 8:
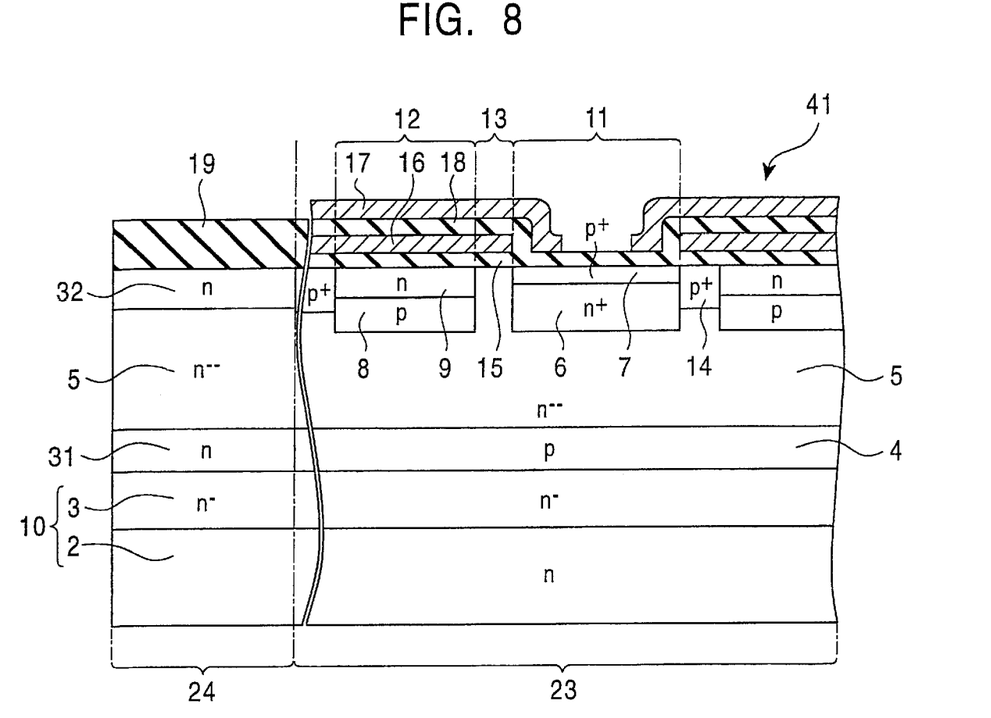
FIG. 8 is a sectional view which schematically shows a major portion of a CCD solid-state imaging device in another embodiment of the present invention.

An embodiment in such a case is shown in FIG. 8.

In a CCD solid-state imaging device 41, an n-type ion-implanted region 31 is formed in an n⁻ epitaxial layer 3 and also an n-type ion-implanted region 32 is formed in a high-resistivity epitaxial layer 5 in a peripheral area 24.

The structure other than the above is the same as that in the previous embodiments.

In such a case, although the number of steps is increased due to the formation of two n-type ion-implanted regions, the degradation in characteristics resulting from the diffusion of p-type impurities can be more effectively prevented.

Additionally, in the present invention, the depth and thickness of the n-type ion-implanted region 31 or 32 are not restricted to the depth and thickness that are substantially the same as those of the channel stop region 14 and the p-type semiconductor well region 4 shown in FIGS. 2, 6, and 8, and can be set appropriately depending on required characteristics.

The n-type ion-implanted region 31 or 32 is not necessarily formed in the entire peripheral area 24.

As long as the n-type ion-implanted region 31 or 32 is formed at least in the vicinity of the interface with the p-type semiconductor well region 4 in the imaging area 23, the degradation in characteristics can be prevented.

In the individual embodiments described above, although the n⁻ epitaxial layer 3 is formed on the n-type semiconductor substrate 2 to constitute a semiconductor base 10 and the p-type semiconductor well region is formed in the semiconductor base 10, a structure may be employed in which the semiconductor base comprises the substrate only, the p-type semiconductor well region is formed directly in the n-type semiconductor substrate, and the high-resistivity epitaxial layer is formed thereon.

Although the CCD solid-state imaging devices have been described in the individual embodiments, the present invention is also applicable to other types of solid-state imaging devices, such as an MOS solid-state imaging device. When the present invention is applied to the MOS solid-state imaging device, a semiconductor well region of a conductive type that is opposite to that of a first conductive type base, e.g., p type, is formed below an imaging area comprising MOS transistors, etc., each formed for a light-receiving section and a pixel, and an ion-implanted region of the first conductive type is formed in a peripheral area in which driving circuits, etc. are formed.

It is to be understood that the present invention is not limited to the embodiments described above, and various alterations can be made within the scope not deviating from the object of the present invention.

In accordance with the present invention, by forming a first conductive type ion-implanted region, the influence of second conductive type impurities diffused from a second conductive type region formed in the base to circuit elements formed in the peripheral area can be suppressed and cancelled.

Consequently, degradation in the characteristics of the solid-state imaging device can be prevented.

It is also possible to change the amount of first conductive type impurities to be doped into the peripheral area in response to the concentration of the second conductive type region in the base, and thus the peripheral area can be stably maintained as the first conductive type.

It is also possible to freely set the concentration of first conductive type impurities in the peripheral area, and for example, setting of the breakdown voltage of a protection transistor formed in the peripheral area can be easily optimized.

In accordance with the fabrication method of the present invention, variations in the thickness of the impurity region and in the concentration of impurities are suppressed, and inconsistencies in the characteristics of elements are suppressed, and thus the solid-state imaging device can be fabricated with a high yield rate.

When first conductive type impurities are ion-implanted after the high-resistivity epitaxial layer is formed, since the first conductive type impurities are not affected by the high temperature during the formation of the epitaxial layer, it is possible to form the first conductivity region with further stability.

What is claimed is:

1. A solid-state imaging device comprising:
   a second conductive type impurity region formed in a first conductive type semiconductor substrate in an area corresponding to a pixel area;
   a high-resistivity semiconductor layer of the first conductive type formed on the semiconductor substrate containing the impurity region; and
   an ion-implanted region of the first conductive type formed in at least one of the semiconductor substrate and the high-resistivity semiconductor layer in a peripheral area other than the pixel area.

2. A method of fabricating a solid-state imaging device comprising:
   a step of forming an impurity region by doping impurities of a second conductive type in a first conductive type semiconductor substrate in an area corresponding to a pixel area;
   a step of growing a high-resistivity epitaxial layer of the first conductive type on the semiconductor substrate containing the impurity region of the second conductive type; and
   at least one of a step of ion-implanting impurities of the first conductive type in the first conductive type semiconductor substrate in a peripheral area other than the pixel area and a step of ion-implanting impurities of the first conductive type in the high-resistivity epitaxial layer in the peripheral area.

3. A solid-state imaging device as set forth in claim 1, wherein because said ion-implanted region of the first conductive type is provided in the peripheral area, second conductive type impurities diffused from the impurity region of the second conductive type can be inhibited from influencing circuit elements formed in the peripheral area.

4. A solid-state imaging device, comprising:

a semiconductor device of a first conductive type;

a first epitaxial layer of said first conductive type formed on said semiconductor device;

a semiconductor region of a second conductive type formed by ion implantation on said first epitaxial layer;

a second epitaxial layer of the first conductive type formed on the first epitaxial layer, a light receiving section formed in the vicinity of a surface of said second epitaxial layer and in an area corresponding to a pixel area; and an ion-implanted region of the first conductive type formed within at least the first epitaxial layer in a peripheral area other than the pixel area, wherein since the ion-implanted region of the first conductive type is formed within the first epitaxial layer of the first conductive type in the peripheral area, occurrence of a pn junction type semiconductor well region is suppressed.

5. A solid-state imaging device as set forth in claim 4, wherein said light-receiving section comprises an impurity diffusion region of the first conductive type and a positive charge storage region located thereon.

6. A solid-state imaging device as set forth in claim 5 further comprising a semiconductor well region and a transfer channel region of the first conductive type formed in said second epitaxial layer.

7. A solid-state device as set forth in claim 5 where a second ion-implanted region of the first conductivity type is formed in said second epitaxial layer and in said peripheral area.

* * * * *